(12) United States Patent
Kuibira et al.

(10) Patent No.: US 7,999,210 B2
(45) Date of Patent: *Aug. 16, 2011

(54) HEATING DEVICE FOR MANUFACTURING SEMICONDUCTOR

(75) Inventors: Akira Kuibira, Itami (JP); Masuhiro Natsuhara, Itami (JP); Hirohiko Nakata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1509 days.

This patent is subject to a terminal disclaimer.

(21) Appl. No.: 10/489,174

(22) PCT Filed: Feb. 26, 2003

(86) PCT No.: PCT/JP03/02137
§ 371 (c)(1),
(2), (4) Date: Mar. 10, 2004

(87) PCT Pub. No.: WO03/073483
PCT Pub. Date: Sep. 4, 2003

(65) Prior Publication Data
US 2004/0238520 A1 Dec. 2, 2004

(30) Foreign Application Priority Data

Feb. 27, 2002 (JP) .................................. 2002-050628

(51) Int. Cl.
*H01L 21/30* (2006.01)
*F27B 5/04* (2006.01)
*F27B 5/14* (2006.01)
*F27D 5/00* (2006.01)
*F27D 11/00* (2006.01)
*H05B 3/74* (2006.01)

(52) U.S. Cl. ...................... 219/390; 219/444.1; 118/728
(58) Field of Classification Search ................ 219/451.1
See application file for complete search history.

(56) References Cited

U.S. PATENT DOCUMENTS

| | | | | |
|---|---|---|---|---|
| 1,647,742 A * | 11/1927 | Mock | .......................... | 219/451.1 |
| 3,757,733 A * | 9/1973 | Reinberg | ...................... | 118/725 |
| 5,177,878 A * | 1/1993 | Visser | ................................ | 34/92 |
| 6,518,548 B2 * | 2/2003 | Sugaya et al. | ............. | 219/444.1 |
| 7,361,865 B2 * | 4/2008 | Maki et al. | ................. | 219/444.1 |
| 2001/0042744 A1 | 11/2001 | Tachikawa et al. | | |
| 2004/0140304 A1 * | 7/2004 | Leyendecker | ................ | 219/386 |

(Continued)

FOREIGN PATENT DOCUMENTS
EP    1 211 912 A1    6/2002
(Continued)

*Primary Examiner* — Joseph M Pelham
(74) *Attorney, Agent, or Firm* — McDermott Will & Emery LLP

(57) ABSTRACT

A heating device for manufacturing semiconductor capable of uniformly heating a wafer or other materials to be treated, and in particular a heating device in a coater-developer used for heat-hardening of resin film for photolithography and for heat-calcining of low-dielectric constant insulating film, is provided.

A device of this invention comprises a ceramic holder 1 having a resistive heating element 2 embedded therein, which holds and heats a wafer 6 or another material to be treated; a cylindrical support member 4 which supports the ceramic holder 1; and a chamber 5 which houses these. The support member 4 and ceramic holder 1 are not hermetically sealed, or alternatively the atmospheres within the cylindrical support member 4 and within the chamber 5 are maintained to be substantially the same by adjusting the introduction and evacuation of gas.

8 Claims, 1 Drawing Sheet

U.S. PATENT DOCUMENTS

2006/0096972 A1 * 5/2006 Nakamura ................. 219/444.1

FOREIGN PATENT DOCUMENTS

| JP | 61194178 A | * | 8/1986 |
| JP | 2000-21957 A | | 1/2000 |
| JP | 2000-114355 | | 4/2000 |
| JP | 2001-237051 A | | 8/2001 |
| JP | 2001237156 A | * | 8/2001 |
| JP | 2001-319758 A | * | 11/2001 |
| JP | 2001-326181 A | | 11/2001 |
| JP | 2001-342079 A | | 12/2001 |
| JP | 2002-25758 A | | 1/2002 |
| JP | 2002-57107 A | | 2/2002 |
| JP | 2002246305 A | * | 8/2002 |
| WO | WO 01/87018 A1 | | 11/2001 |

* cited by examiner

HEATING DEVICE FOR MANUFACTURING SEMICONDUCTOR

TECHNICAL FIELD

This invention relates to a heating device for manufacturing semiconductor, and in particular to the heating device of a coater-developer for which thermal uniformity is required.

BACKGROUND ART

In semiconductor manufacturing, Al circuits and Cu circuits are formed on silicon wafers by Al sputtering, Cu plating, and other means, but the higher integration levels and smaller sizes of semiconductor devices in recent years have been accompanied by a steady trend toward narrower wiring line widths and spaces between wiring lines (intervals).

The wiring patterns of Al circuits and Cu circuits are formed using photolithography techniques. For example, after uniformly coating a resin on an Al film, an exposure system called a stepper is used to print a pattern in the resin film, and by heat-hardening the resin film and removing needless portions, a removal-pattern resin film is formed on top of the Al film for wiring. Then an etching system is used to etch the Al film along the removal-pattern portion, and on removing the resin film, patterned Al wiring is obtained.

When wiring lines are in close proximity, signals in the lines interact each other; hence there is a need to eliminate interaction between wiring lines by filling areas between wiring lines and between stacked layers with low-dielectric constant insulating material. Conventionally, silicon oxide has been used as the insulating material for this purpose; but more recently materials known as low-k materials have been used as insulating films with still lower dielectric constants. Low-k insulating films are formed by dispersing the material in a dispersing medium in slurry form, which is used in spin-coating to form a uniform film; then photolithography techniques similar to those described above are employed in pattern formation, following by heat-calcining using a heater to harden the film.

Heat-hardening of resin film for photolithography and heat-calcining of low-dielectric constant insulating film such as low-k film is performed within a system called a coater-developer; as the heater, for example, a heater formed by enclosing SUS foil, which is a resistive heating element, between quartz glass plates is used. However, because there are problems, which are the thermal uniformity and durability, with such a heater, a heating device comprising a heater which affords excellent thermal uniformity and high durability has been sought.

On the other hand, CVD equipment used to form various thin films employ a ceramic heater, in which an Mo coil is embedded by hot-press sintering of AlN, $Si_3N_4$, or another ceramic material with high thermal conductivity and good corrosion resistance. The surface on the rear of the wafer-holding surface of this ceramic heater is bonded to one end of a cylindrical ceramic support member, the other end of which is supported by the chamber and sealed with an O-ring. Electrode terminals and lead wires to supply electrical power are poor corrosion resistant and housed within the cylindrical support member so as not to be exposed to the corrosive gas used within the chamber.

In recent years, Si wafer sizes have been increased in order to lower semiconductor manufacturing costs, and wafer diameters are moving from 8 inches to 12 inches. Consequently in coater-developers used for heat-hardening of resin films for photolithography and heat-calcining of low-k and other low-dielectric constant insulating films, there are intensified demands for thermal uniformity of the heater. Specifically, it is required that the thermal uniformity of the wafer-holding surface of the heater be within ±1.0%, and preferably within ±0.5%.

In general, by using ceramic material with high thermal conductivity embedded a resistive heating element as a heater, the heat generated by the resistive heating element is diffused within the ceramic material, and thermal uniformity can be maintained at the wafer-holding surface. Further, by using ceramic material with high heat resistance, a heater with excellent durability is obtained.

For example, when a configuration similar to that of an AlN ceramic heater used in CVD equipment is employed, one end of a cylindrical AlN support member is bonded to the center of the rear surface opposite the wafer-holding surface, and the other end is supported by bonding to the chamber. In addition, the electrode terminals and lead wires for the supply of power are housed within the cylindrical support member.

However, both ends of the cylindrical support member supporting the ceramic heater are hermetically sealed, and the interior is isolated from the interior of the chamber, so that the outer periphery is exposed to the reduced-pressure atmosphere within the chamber, while the inner periphery is exposed to an air atmosphere at atmospheric pressure. In this case, thermal transmission through air at atmospheric pressure is greater, so that the temperature is lower on the inner periphery of the support member than on the outer periphery, and this effect also appears at the wafer-holding surface; as a result, it is not able to achieve the required thermal uniformity of within ±1.0%.

When the interior of the cylindrical support member is bonded and hermetically sealed so as to be completely isolated from the chamber, if the thermal expansion coefficients of the ceramic heater and that of a support member are different, then the difference in thermal shrinkage during cooling processes causes thermal stresses, and cracks tend to appear in the brittle ceramic material. In order to prevent this, the support member must be fabricated from the same material with high thermal conductivity as the ceramic heater. However, in this case, heat generated by the ceramic heater easily escapes via the support member, and the temperature of the ceramic heater is greatly reduced at the joined portion, so that it cannot maintain thermal uniformity.

DISCLOSURE OF THE INVENTION

This invention was devised in light of these circumstances of the prior art, and has as an object the provision of a heating device for manufacturing semiconductor capable of uniformly heating a wafer or other materials to be treated, and in particular of a heating device used for heat-hardening of resin film for photolithography in a coater-developer and for heat-calcining of low-dielectric constant insulating film, capable of thermal uniformity to within ±1.0% at the surface holding the material to be treated, and more preferably capable of thermal uniformity to within ±0.5%.

In order to achieve the above object, a heating device for manufacturing semiconductor provided by this invention comprises a plate-shaped ceramic holder having a resistive heating element embedded therein, which holds and heats a material to be treated on a surface thereof; a cylindrical support member, which supports the ceramic holder at a position other than the surface holding the material to be treated; and a chamber, which houses the ceramic holder and support member; and wherein an atmosphere in a space formed within the cylindrical support member is maintained to be substantially same as an atmosphere within the chamber.

In the above heating device for manufacturing semiconductor of this invention, it is preferable that the above support member is not hermetically sealed to the ceramic holder. Also, it is preferable that the area over which above support member makes contact with and supports the ceramic holder be ⅕ or less than the total area of the ceramic holder. Further, it is preferable that the above support member is of cylindrical shape having a plurality of openings in the side surface, or is a framework structure. Further, it is preferable that the thermal conductivity of the above support member is lower than the thermal conductivity of the ceramic holder.

In the above heating device for manufacturing semiconductor of this invention, it is preferable that the above support member has as a principal component at least one among $Al_2O_3$, $ZrO_2$, $Si_3N_4$, quartz, mullite, forsterite, and spinel. Further, it is preferable that the above support member has as a principal component at least one among stainless steel, nichrome, Ti, V, and Zr. Further, it is preferable that the above support member is formed from stainless steel.

In this invention, the above heating device for manufacturing semiconductor is characterized in being a heating device of a coater-developer used for heat-hardening of resin film for photolithography or for heat-calcining of low-dielectric constant insulating film.

In a heating device for manufacturing semiconductor of this invention, a ceramic holder within which is embedded a resistive heating element in order to heat a wafer or another material to be treated is used, and is supported within a chamber by the support member at a position other than the surface for holding a material to be treated, for example, on the rear surface. In addition, by maintaining at atmosphere of substantially the same gas type and the same gas pressure on the inner side and the outer side of the support member, the escape of heat from the ceramic holder due to thermal conduction via gas on the outer side and inner side of the support member is eliminated, so that the thermal uniformity on the surface of the ceramic holder, the surface holding a material to be treated, can be improved.

However, because a heating device for coater-developers in semiconductor manufacturing is used for heat-hardening of resin film for photolithography and for heat-calcining of low-dielectric constant insulating films, in contrast with CVD equipment and etching equipment which uses corrosive gases including halogen elements, the heating device is used in the atmosphere such as He, Ar, $N_2$, $H_2$, and similar; hence even if the interior of the support member in which are housed electrodes and lead wires for power supply are in the same atmosphere as in the chamber, there is no corrosion of the electrodes and lead wires for power supply, which use W, Mo, and similar as principal components.

In order to maintain substantially the same atmosphere in the space formed within the cylindrical support member as in the chamber, it is sufficient to employ a configuration in which the support member and ceramic holder are not bonded with a hermetic seal, but the atmosphere gas within the support member and within the chamber can flow through a gap between the two. Further, when bonding and hermetically sealing the support member with the ceramic holder, it is possible to adjust gas introduction and evacuation between the interior of the support member and the interior of the chamber, to obtain the same atmosphere in both. From the standpoint of cost, it is preferable that the former method be used, in which only measures to prevent position shifts are taken, without applying a hermetic seal, to place the ceramic holder onto the support member.

When the support member and ceramic holder are bonded and hermetically sealed, heat escapes to the support member by thermal transmission via the bonding plane, so that a temperature gradient occurs in the ceramic holder, and the thermal uniformity of the surface holding a material to be treated is worsened. On the other hand, if a configuration is adopted in which the support member and ceramic holder are not bonded and hermetically sealed either, thermal transmission via the support member can be suppressed, and so the temperature decline at the surface holding a material to be treated is reduced, and thermal uniformity can be further improved.

In order to still more effectively suppress the transmission of heat from the ceramic holder to the support member, it is preferable that the area over which the support member is in contact with and supports the ceramic holder is ⅕ or less than the total area of the ceramic holder. In addition, if the shape of the support member is cylindrical having a plurality of holes in the side wall, or is a framework structure, then the transmission of heat in the support member is impeded, and the thermal uniformity in the ceramic holder is improved. Moreover, no difference in pressure between the inside and the outside of the support member occurs when the chamber interior is evacuated, and no damage is imparted to the support member or ceramic holder, which is preferable.

In order to further reduce the escape of heat via the support member, it is effective to make the thermal conductivity of the material forming the support member lower than the thermal conductivity of the ceramic material forming the ceramic holder. As the material forming the support member, when the support member is to be bonded to the ceramic holder, it is desirable that a material which has the same or nearly the same thermal expansion coefficient is used; if no bonding is made, there is no constraint on the thermal expansion coefficient, any material which does not have an adverse effect on the product and any material which can withstand usage temperatures may be used.

As examples of materials forming the support member, materials which have low thermal conductivity and excellent durability include materials the principal component of which is $Al_2O_3$, $ZrO_2$, $Si_3N_4$, quartz, mullite, forsterite, or spinel. Materials which are preferable from the standpoint of low thermal conductivity, toughness, and material cost include materials the principal component of which is stainless steel, nichrome, Ti, V, or Zr. Among these, stainless steel is the most preferable in consideration of its low thermal conductivity, toughness, material cost, and machinability.

As ceramic materials forming the ceramic holder, in consideration of heat resistance, thermal conductivity and durability, it is preferable that aluminum nitride, silicon nitride, silicon carbide, aluminum oxide, quartz or similar is used; but there are no constraints in particular. As the resistive heating element, any material which can be embedded in a ceramic holder and which has heat resistance and an appropriate resistivity, such as W, Mo, Ag, Pd, Pt, Ni, Cr, SUS and similar, may be used.

A heating device for manufacturing semiconductor of this invention is particularly appropriate as a heating device in a coater-developer used for heat-hardening of resin film for photolithography and for heat-calcining of low-dielectric constant insulating films such as low-k films.

BEST MODE FOR CARRYING OUT THE INVENTION

This invention is explained in detail below, based on examples and comparative examples.

Example 1

0.5 weight percent yttria ($Y_2O_3$) was added as a sintering agent to aluminum nitride (AlN) powder, and after further adding an organic binder, dispersing and mixing, spray-drying was used for granulation. The granulated powder was molded using a uniaxial press, to obtain, after sintering, two disc-shaped molded bodies of diameter 350 mm and thickness 5 mm. The molded bodies were degreased at a temperature of 800° C. in a nitrogen flow, followed by sintering for two hours at 1900° C. in a nitrogen flow. The surfaces of the two sintered bodies thus obtained were polished using diamond abrasives.

A slurry formed by adding a sintering agent and ethyl cellulose binder to W powder and kneading was used to print a resistive heating element circuit on one surface of one of the disc-shaped AlN sintered bodies, and after degreasing at 900° C. in a nitrogen flow, the bodies were fired for one hour at 1850° C. A slurry formed by adding an ethyl cellulose binder to a bonding glass and kneading was applied to one surface of the other disc-shaped sintered body, and it was degreased at 900° C. in a nitrogen flow.

Figure 1:
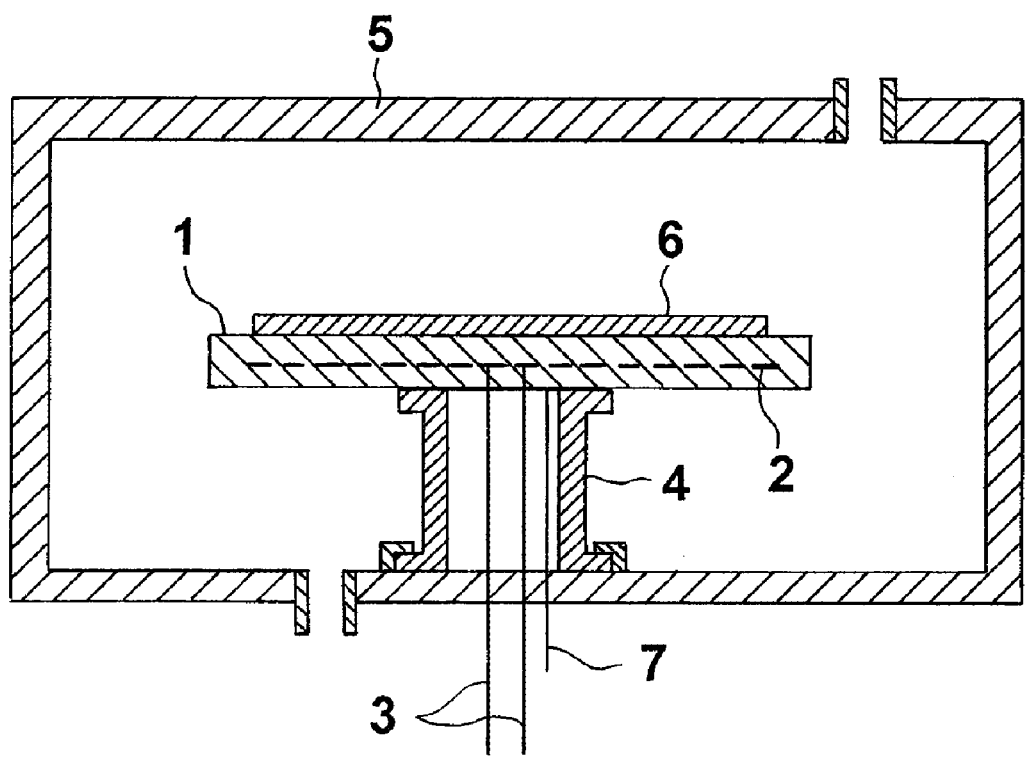
FIG. 1 is a summary cross-sectional view showing one embodiment of a heating device for manufacturing semiconductor of this invention.

The above two sintered bodies were stacked, with the bonding glass surface of the other sintered body facing the resistive heating element surface of the one sintered body, and with a 50 g/cm² load applied to prevent slippage, the two sintered bodies were bonded together by heating for two hours at 1800° C., to fabricate a ceramic holder 1 in the interior of which was embedded a resistive heating element 2, as shown in FIG. 1.

On the rear surface of the ceramic holder 1, electrode terminals (not shown) to be connected to the resistive heating element 2 are bonded, and are connected to power supply lead wires 3, which are electrically connected to an external power supply. The thermal conductivity of the AlN forming the ceramic holder 1 was 180 W/mK.

Figure 2:
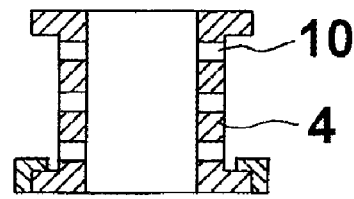
FIG. 2 is a cross-sectional view of the cylindrical support member.

Further, a cylindrical support member 4, consisting of SUS pipe with thermal conductivity 80 W/mK, with outer diameter of 100 mm, inner diameter of 90 mm and length 100 mm, and provided with flanges on both ends, was fabricated. The cylindrical support member 4, has a plurality of holes 10 in the side wall, or is a framework structure, as shown in FIG. 2. A flange on one end of this cylindrical support member 4 was fixed by clamping to the chamber 5, and the ceramic holder 1 was placed, without bonding, on the flange on the other end thereof.

The ratio $S_1/S_0$ of the area $S_1$ over which the support member 4 was in contact with and supported the ceramic holder 1 to the total area $S_0$ of the ceramic holder was 1/64. The lead wires 3 for power supply were drawn through the interior of the cylindrical support member 4 to the outside.

The interior of the chamber 5 was an $N_2$ atmosphere depressurized to 13 Pa (0.1 torr), and power was supplied from outside to the resistive heating element 2 to heat the ceramic holder to 500° C. At this time, upon using the thermocouple 7 to measure the thermal uniformity over the entire surface holding the material to be treated on which a wafer 6 is to be placed, the thermal uniformity of the surface of the ceramic holder 1 for holding the material to be treated was 500° C.±0.4%.

Example 2

A ceramic holder and support member were fabricated by the same method as in the above Example 1, but the ratio $S_1/S_0$ of the area $S_1$ over which the support member was in contact with and supported the ceramic holder to the total area $S_0$ of the ceramic holder was varied. The ceramic holder and support member were assembled the same way as Example 1, and the same method as in Example 1 was used to evaluate the thermal uniformity of the ceramic holder.

The evaluation results are shown in Table 1 below.

TABLE 1

| Ratio $S_1/S_0$ | Thermal uniformity |
|---|---|
| 1/15 | 500° C. ± 0.45% |
| 1/5 | 500° C. ± 0.5% |
| 1/4 | 500° C. ± 0.6% |
| 1/2 | 500° C. ± 0.95% |

Example 3

Except for substituting aluminum oxide ($Al_2O_3$) as the material of the support member, fabrication was the same way as that of the above Example 1. That is, 2 weight percent magnesia (MgO) was added as a sintering agent to $Al_2O_3$ powder, and after further adding an organic binder, dispersing and mixing, spray-drying was used for granulation.

The granulated powder was molded using a cold isostatic press (CIP), to obtain, after sintering, a shape of outer diameter 100 mm, inner diameter 90 mm and length 100 mm, having flanges at both ends. After sintering this molded body in air for three hours at 1500° C., the surface was polished using diamond abrasives, to obtain a cylindrical support member of $Al_2O_3$ with a thermal conductivity of 30 W/mK.

The flange at one end of this $Al_2O_3$ support member was fixed by clamping to the chamber interior, and the same ceramic holder as in the above Example 1 (of AlN, thermal conductivity 180 W/mK) was placed, without bonding, on the flange at the other end. The thermal uniformity of the surface of the ceramic holder for holding the material to be treated, measured under the same conditions as in Example 1, was 500° C.±0.45%.

Example 4

Except for substituting aluminum nitride as the material of the support member, fabrication was the same way as that of the above Example 1. That is, AlN granulated powder was fabricated under the same conditions as in the above Example 1. The granulated powder was molded using CIP to obtain, after sintering, a shape of outer diameter 100 mm, inner diameter 90 mm and length 100 mm, having flanges at both ends. After degreasing this molded body in a nitrogen flow at 800° C. and sintering in a nitrogen flow for two hours at 1900° C., the surface was polished using diamond abrasives, to obtain a cylindrical support member of AlN with a thermal conductivity of 180 W/mK.

The flange at one end of this AlN support member was fixed by clamping to the chamber interior, and the same ceramic holder as in the above Example 1 (of AlN, thermal conductivity 180 W/mK) was placed, without bonding, on the flange at the other end. The thermal uniformity of the surface of the ceramic holder for holding the material to be treated, measured under the same conditions as in Example 1, was 500° C.±0.7%.

Example 5

Except for bonding the support member to the rear surface of the ceramic holder, fabrication was the same way as that of the above Example 4. That is, a bonding paste was applied to the flange surface at one end of a support member of AlN, which was fabricated under the same conditions as in the above Example 4, and the flange surface was placed on the rear surface of a ceramic holder of AlN fabricated under the same conditions as in the above Example 1, and bonding was performed by heating in nitrogen at 1700° C. for two hours.

The flange at one end of this support member was fixed by clamping to the chamber interior, and the lead wires for power supply, which was connected to the electrode terminals of the resistive heating element, were guided through the interior of the cylindrical support member to the outside. By adjusting the introduction and evacuation of gas between the interior of the support member and the chamber interior, the $N_2$ atmosphere in the chamber and in the support member was maintained at a reduced pressure of 13 Pa (0.1 torr).

The ceramic holder (of AlN, thermal conductivity 180 W/mK) bonded to the AlN support member was heated to 500° C., and the thermal uniformity of the surface of the ceramic holder for holding the material to be treated, measured under the same conditions as in Example 1, was 500° C.±0.9%.

Example 6

Except for enclosing W foil etched in a prescribed pattern between the two AlN sintered bodies and bonding instead of applying and heating the W paste during fabrication of the resistive heating element, a ceramic holder was fabricated under the same conditions, including the pattern of the resistive heating element, as in the above Example 1.

The flange at one end of this AlN support member, fabricated under the same conditions as in the above Example 4, was fixed by clamping to the chamber, and the ceramic holder was placed on the flange at the other end. In addition, lead wires connected to the electrode terminals were guided through the interior of the cylindrical support member to the outside. The thermal conductivity of the AlN forming the ceramic holder and the support member was 180 W/mK.

The $N_2$ atmosphere within the chamber and within the support member was depressurized to 13 Pa (0.1 torr), and the ceramic holder was heated to 500° C. At this time, the thermal uniformity of the surface of the ceramic holder for holding the material to be treated, measured under the same conditions as in Example 1, was 500° C.±0.6%.

Example 7

Grooves of width 4.5 mm and depth 2.5 mm were formed on the surfaces of two molded bodies of AlN, fabricated under the same conditions as in the above Example 1, followed by degreasing at 800° C. in a nitrogen flow. After laying an Mo coil in the groove, the two molded bodies were stacked and bonded simultaneously with sintering at 1900° C. for two hours in a nitrogen flow under a pressure of 100 kgf/cm$^2$, to fabricate a ceramic holder.

The surface of this ceramic holder was polished using diamond abrasives, electrode terminals to be connected to the resistive heating element were bonded to the rear surface, and these were bonded to lead wires for the supply of power, which were electrically connected to an outside power supply.

A cylindrical support member of AlN was fabricated under the same conditions as in the above Example 4; the flange at one end was fixed by clamping to the chamber interior, and the above ceramic holder was placed, without bonding, onto the flange at the other end. The thermal conductivity of the AlN forming the ceramic holder and support member was 180 W/mK.

The $N_2$ atmosphere within the chamber and within the support member was depressurized to 13 Pa (0.1 torr), and the ceramic holder was heated to 500° C. At this time, the thermal uniformity of the surface of the ceramic holder for holding the material to be treated, measured under the same conditions as in Example 1, was 500° C.±0.8%.

Comparative Example 1

A ceramic holder and support member, both of AlN and fabricated under the same conditions as the above Example 4, were bonded, and an oxidation-resistant seal was applied to the portion connecting the electrode terminals provided on the rear surface and the lead wires for power supply. The flange at one end of the support member was fixed by clamping to the chamber. The thermal conductivity of the AlN forming the ceramic holder and the support member was 180 W/mK.

While depressurizing the $N_2$ atmosphere within the chamber to 13 Pa (0.1 torr), the interior of the cylindrical support member was filled with air at atmospheric pressure. At this time, the thermal uniformity of surface of the ceramic holder for holding the material to be treated, measured under the same conditions as in Example 1, was 500° C.±1.5%, so that the required value of within ±1.0% could not be satisfied.

Comparative Example 2

A SUS resistive heating element having the same pattern as in the above Example 1 was formed by etching. Bonding glass was applied to two quartz plates, of diameter 350 mm and thickness 5 mm, and after enclosing the above SUS resistive heating element therebetween, the plates were bonded by heating at 800° C., to fabricate a holder with a conventional configuration.

Bonding glass was used to bond a support member, formed from quartz and with the same dimensions as the support member in the above Example 1, to the rear surface of this holder. One end of this cylindrical support member was fixed by clamping to the chamber, and the lead wires, which was connected to the electrode terminals of the resistive heating element, were guided through the inside of the support member to the outside. The thermal conductivity of the quartz material forming the ceramic holder and support member was 15 W/mK.

The $N_2$ atmosphere within the chamber was depressurized to 13 Pa (0.1 torr), while filling the interior of the cylindrical support member with air at atmospheric pressure. At this time, the thermal uniformity of the surface of the ceramic holder for holding the material to be treated, measured under the same conditions as in Example 1, was 500° C.±1.8%, so that the required value of within ±1.0% could not be satisfied.

INDUSTRIAL APPLICABILITY

By means of this invention, a heating device for manufacturing semiconductor capable of uniform heating of a wafer or other materials to be treated can be provided. This heating device is particularly appropriate as a heating device used in heat-hardening of resin film for photolithography and in heat-calcining of low-dielectric constant insulating film in a coater-developer, and can achieve a thermal uniformity over the treated material-holding surface of within ±1.0%.

The invention claimed is:

1. A heating device for manufacturing semiconductor for chemical vapor deposition (CVD) equipment or etching equipment, comprising:
    a plate-shaped ceramic holder having a resistive heating element embedded therein, which holds and heats a material to be treated on a surface thereof;
    a cylindrical support member, which supports the ceramic holder at a position other than the surface holding a material to be treated; and
    a chamber, which houses the ceramic holder and the support member, and the interior of which can be depressurized;
    wherein the cylindrical support member and the plate-shaped ceramic holder are not bonded, and wherein an atmosphere in a space formed within the cylindrical support member is maintained to be substantially same as an atmosphere within the chamber.

2. A heating device for manufacturing semiconductor for CVD equipment or etching equipment according to claim 1, wherein said support member is not hermetically sealed to the ceramic holder.

3. A heating device for manufacturing semiconductor for CVD equipment or etching equipment according to claim 1 or claim 2, wherein an area over which said support member is in contact with and supports the ceramic holder is ⅕ or less of a total area of the ceramic holder.

4. A heating device for manufacturing semiconductor for CVD equipment or etching equipment according to claim 1 or claim 2, wherein said support member is cylindrical having a plurality of holes in a side wall thereof.

5. A heating device for manufacturing semiconductor for CVD equipment or etching equipment according to claim 1 or claim 2, wherein a thermal conductivity of said support member is lower than a thermal conductivity of the ceramic holder.

6. A heating device for manufacturing semiconductor for CVD equipment or etching equipment according to claim 1 or claim 2, wherein said support member has as a principal component at least one among $Al_2O_3$, $ZrO_2$, $Si_3N_4$, quartz, mullite, forsterite and spinel.

7. A heating device for manufacturing semiconductor for CVD equipment or etching equipment according to claim 1 or claim 2, wherein said support member has as a principal component at least one among stainless steel, nichrome, Ti, V and Zr.

8. A heating device for manufacturing semiconductor for CVD equipment or etching equipment according to claim 7, wherein said support member is formed from stainless steel.

* * * * *